United States Patent
Ishihara et al.

(10) Patent No.: US 7,642,779 B2
(45) Date of Patent: Jan. 5, 2010

(54) MRI RF COIL CONFIGURED TO DECOUPLE COIL ELEMENTS AND MRI APPARATUS EMPLOYING THE SAME

(75) Inventors: Takahiro Ishihara, Otawara (JP); Kazuya Okamoto, Saitama (JP); Shinji Mitsui, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/049,689

(22) Filed: Mar. 17, 2008

(65) Prior Publication Data

US 2008/0231278 A1 Sep. 25, 2008

(30) Foreign Application Priority Data

Mar. 22, 2007 (JP) ............................. 2007-074794
Jan. 18, 2008 (JP) ............................. 2008-009068

(51) Int. Cl.
G01V 3/00 (2006.01)
(52) U.S. Cl. ..................................................... 324/318
(58) Field of Classification Search ......... 324/300–322; 600/410–435; 333/219–235; 343/725–738, 343/741–744, 850–871, 893
See application file for complete search history.

(56) References Cited

U.S. PATENT DOCUMENTS

| | | | |
|---|---|---|---|
| 4,825,162 A | 4/1989 | Roemer et al. | |
| 5,166,618 A * | 11/1992 | Jones et al. | 324/318 |
| 5,221,902 A * | 6/1993 | Jones et al. | 600/422 |
| 5,361,765 A * | 11/1994 | Herlihy et al. | 600/422 |
| 5,519,321 A * | 5/1996 | Hagen et al. | 324/318 |
| 6,163,240 A * | 12/2000 | Zuk et al. | 335/299 |
| 6,265,960 B1 * | 7/2001 | Schauwecker et al. | 335/301 |
| 6,493,572 B1 * | 12/2002 | Su et al. | 600/422 |
| 6,600,401 B2 * | 7/2003 | Zuk et al. | 335/299 |
| 6,701,177 B2 * | 3/2004 | Su | 600/422 |
| 6,788,057 B1 * | 9/2004 | Petropoulos et al. | 324/318 |
| 7,498,809 B2 * | 3/2009 | Takahashi et al. | 324/309 |
| 2007/0096738 A1 | 5/2007 | Gunamony | |

FOREIGN PATENT DOCUMENTS

JP 2006-014823 1/2006

* cited by examiner

*Primary Examiner*—Brij B Shrivastav
*Assistant Examiner*—Dixomara Vargas
(74) *Attorney, Agent, or Firm*—Nixon & Vanderhye PC (57) ABSTRACT

A radio-frequency coil has a first element and a second element both being adjacently arranged so as to nip a division/join portion. The first element has a first main loop portion provided along an arrangement plain surface and a first sub-loop portion provided along a surface substantially perpendicular to the arrangement plain surface. The second element has a second main loop portion provided along the arrangement plain surface and a second sub-loop portion provided facing the first sub-loop. The first sub-loop portion and the second sub-loop portion generate an induced electromotive force such that, among magnetic fields generated when a current flows in one coil, a summation of the magnetic fields, which interlink with the other coil, becomes zero.

25 Claims, 8 Drawing Sheets

ENLARGED PERSPECTIVE VIEW

MRI RF COIL CONFIGURED TO DECOUPLE COIL ELEMENTS AND MRI APPARATUS EMPLOYING THE SAME

CROSS-REFERENCE TO RELATED APPLICATIONS

This application is based upon and claims the benefit of priority from the prior Japanese Patent Application No. 2007-074794, filed on Mar. 22, 2007; and Japanese Patent Application No. 2008-009068, filed on Jan. 18, 2008, the entire contents of which are incorporated herein by reference.

BACKGROUND OF THE INVENTION

1. Field of the Invention

The present invention relates to a magnetic resonance imaging (MRI) apparatus and a radio-frequency (RF) coil that is connected to the MRI apparatus and receives a magnetic resonance signal that a subject generates, and particularly, relates to a decoupling of an RF coil device where a plurality of elements (coil elements) are arranged.

2. Description of the Related Art

A method has been known in which a plurality of elements are arranged at a desired region of a subject that should be imaged, and a magnetic resonance signal is detected from the subject via each of the elements; then, an imaging processing is performed relative to each of the detected magnetic resonance signals to generate image data in a plurality of groupings; thereafter, the respective pixel data corresponding to the same space position (a single complex signal or an one-dimensional complex signal being equal to a spectral signal) are multiplied by a weighting function that has been determined in advance based on a distribution of a radio-frequency magnetic field that each element generates, the resultant products are summed to generate each pixel data, and pixel data in the desired region are integrated; accordingly, an image having high signal-to-noise ratio is obtained.

In such a method, because the magnetic resonance signals are simultaneously observed by use of the elements within a time necessary for obtaining one image, it is required to prevent coils from mutually coupling (hereinafter, "decoupling") in such a manner that the elements do not constantly interfere with each other; in other words, that even when a radio-frequency current having a predetermined frequency is flowing in one element, the radio-frequency current does not flow in other elements.

In the technology disclosed in the U.S. Pat. No. 4,825,162, two elements, which have been arranged in a line on a predetermined arrangement plane surface, are overlapped only at an area determined by the area encircled by the coil on the arrangement surface, whereby the decoupling is performed as a state where, among magnetic fields generated when the current is flowing in one element, a summation of the magnetic fields, which interlink with another element, becomes zero.

On the other hand, a radio-frequency coil device, which is connected with a magnetic resonance imaging (MRI) apparatus to receive the magnetic resonance signal generated from the subject, generally has heavy weight. Therefore, in a method disclosed in JP-A 2006-14823 (KOKAI), a dividing/joining is performed between two adjacent elements.

However, in a decoupling method described in the U.S. Pat. No. 4,825,162, it is necessary to overlap two elements at a division/join portion of a case in the arrangement plane surface. As a result, the method had an unresolved issue, for example, that a shape of the case at the portion to be overlapped had to be thinly designed, or that the case was not capable of being divided at a surface perpendicular to an alignment direction of the elements due to a necessity for overlapping, whereby the division/join portion became uneven.

SUMMARY OF THE INVENTION

According to one aspect of the present invention, in a radio-frequency (RF) coil, a plurality of coil elements are arranged, each of which receives a magnetic resonance signal from a subject, wherein at least a first coil element, which is one coil element of non-adjacent two coil elements, has a main loop and a sub-loop connected with the main loop in series, and performs a decoupling with a second coil element, which is the other coil element, by using the sub-loop.

According to another aspect of the present invention, in a radio-frequency (RF) coil, a plurality of coil elements, each of which receives a magnetic resonance signal from a subject, are arranged in each of a first unit and a second unit, where the two units can be joined with or separated from each other, wherein at least a first coil element, which is one coil element among the coil elements in the first unit, has a first main loop and a first sub-loop connected with the first main loop in series, at least a second coil element, which is one coil element among the coil elements in the second unit, has a second main loop, and a second sub-loop connected with the second main loop in series and facing the first sub-loop at a portion capable of joining/separating and is oppositely-orientated with respect to a winding direction of the first sub-loop, and a retaining unit is provided that retains a positional relationship where the first sub-loop and the second sub-loop are mutually faced.

According to still another aspect of the present invention, in a radio-frequency (RF) coil, a plurality of coil elements, each of which receives a magnetic resonance signal from a subject, are provided in a first unit and a second unit, where the two units can be joined with or separated from each other, wherein a first coil element, which is one coil element among the coil elements, is arranged in the first unit, and has a first main loop, and a first sub-loop connected with the first main loop in series, a second coil element, which is one coil element among the coil elements, is arranged in the second unit, and has a second main loop, and a second sub-loop connected with the second main loop in series, facing the first sub-loop, and oppositely-orientated with respect to a winding direction of the first sub-loop, and a third coil element among the coil elements configures a third main loop via an electrical connector in a state where the first unit is joined with the second unit.

According to still another aspect of the present invention, a magnetic resonance imaging (MRI) apparatus includes an applying unit that applies a gradient magnetic field to a subject while applying a static magnetic filed to the subject; and a plurality of coil elements, each of which receives a magnetic resonance signal from the subject to which the static magnetic field and the gradient magnetic field are applied, wherein at least a first coil element, which is one coil element of non-adjacent two coil elements, has a main loop and a sub-loop connected with the main loop in series, and performs a decoupling with a second coil element, which is the other coil elements by using the sub-loop.

According to still another aspect of the present invention, a magnetic resonance imaging (MRI) apparatus includes an applying unit that applies a gradient magnetic field to a subject while applying a static magnetic filed to the subject; and a plurality of coil elements that are provided in each of a first unit and a second unit, where the two units can be joined with or separated from each other, each of the coil elements receiving a magnetic resonance signal from the subject to which the static magnetic field and the gradient magnetic field are applied, wherein at least a first coil element, which is one coil element among the coil elements in the first unit, has a first main loop and a first sub-loop connected with the first main loop in series, at least a second coil element, which is one coil element among the coil elements in the second unit, has a second main loop, and a second sub-loop connected with the second main loop in series, facing the first sub-loop at a portion capable of joining/separating, and oppositely-orientated with respect to a winding direction of the first sub-loop, and a retaining unit is provided that retains a positional relationship where the first sub-loop and the second sub-loop are mutually faced.

DETAILED DESCRIPTION OF THE INVENTION

Exemplary embodiments of a radio-frequency (RF) coil and a magnetic resonance imaging (MRI) apparatus according to the present invention are described in detail below with reference to the accompanying drawings. It should be noted that the present embodiment shall not limit the scope of the present invention.

First Embodiment

Figure 1:
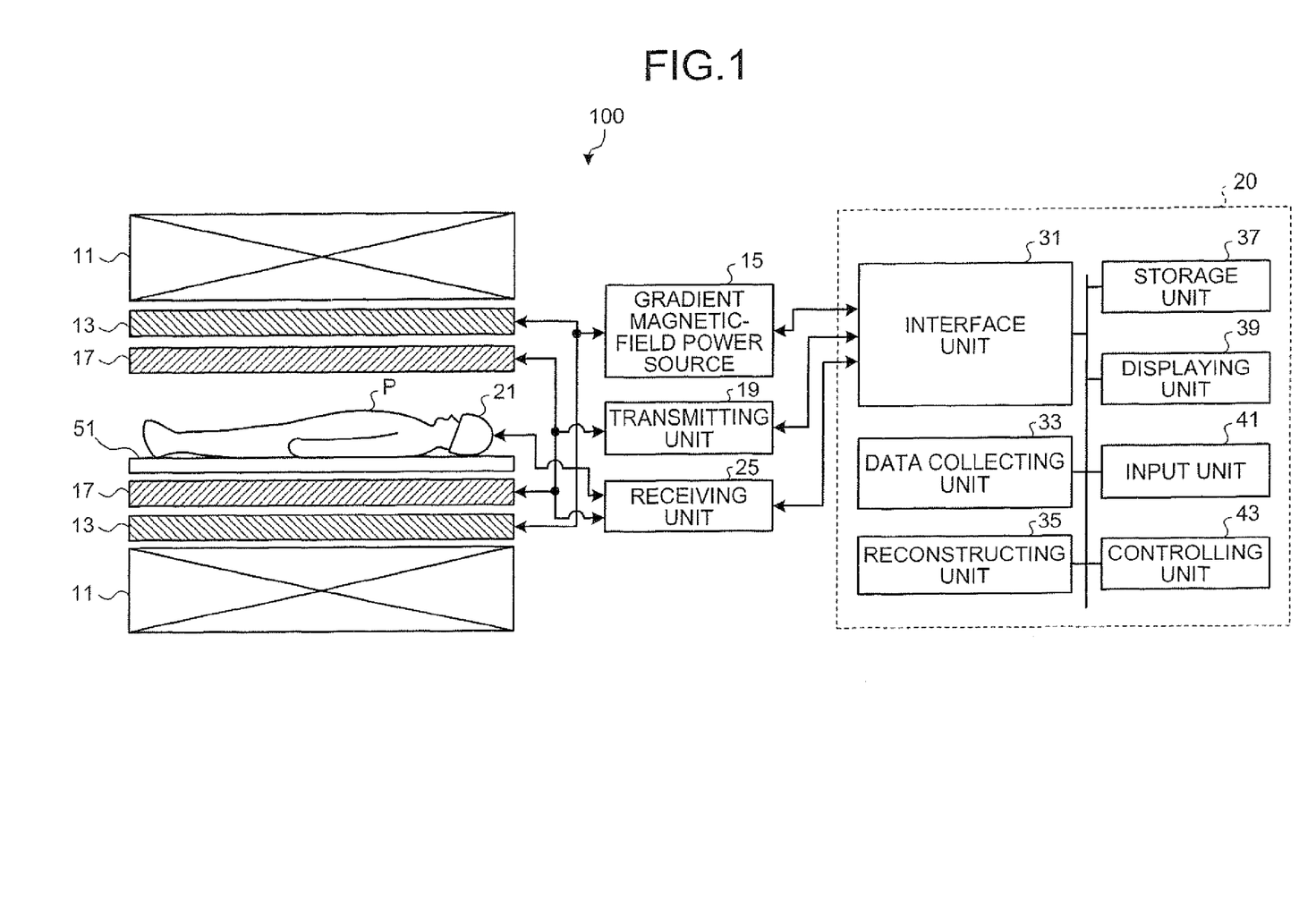
FIG. 1 is a system configuration view illustrating a magnetic resonance imaging (MRI) apparatus according to a first embodiment of the present invention.

FIG. 1 is a system configuration view illustrating the MRI apparatus according to a first embodiment of the present invention. An MRI apparatus 100 has a static magnetic field magnet 11, a gradient magnetic field coil 13, a gradient magnetic-field power source 15, a radio-frequency coil 17, a transmitting unit 19, a helmet-type head coil device 21, and a receiving unit 25.

The cylindrical static magnetic field magnet 11 generates an even static magnetic field in an internal space. The static magnetic field magnet 11 uses, for example, a permanent magnet or a superconductive magnet. Inside the static magnetic field magnet 11, the cylindrical gradient magnetic field coil 13 is arranged. The gradient magnetic field coil 13 includes three coils corresponding to axes of X, Y, and Z, respectively, each of which is mutually perpendicular. Each of the three coils separately receives current supplies from the gradient magnetic-field power source 15 to generate the gradient magnetic field, in which a magnetic field strength slants along each axis of X, Y, and Z. The direction of the Z axis is the same as the direction of the static magnetic field.

The cylindrical radio-frequency coil 17 is positioned inside the gradient magnetic field coil 13. The subject P, which is laid on a patient coach top 51, is inserted into the radio-frequency coil 17. The radio-frequency coil 17 receives a supply of a radio-frequency pulse from the transmitting unit 19 to generate a radio-frequency magnetic field. The radio-frequency coil 17 also receives a magnetic resonance signal emitted from the subject P due to the radio-frequency magnetic field.

The transmitting unit 19 includes an oscillating unit, a phase selecting unit, a frequency converting unit, an amplitude modulating unit, and a radio-frequency power amplifying unit. The oscillating unit generates a radio-frequency signal of a resonance frequency unique to a nuclear of the subject in the static magnetic field. The phase selecting unit selects a phase of the radio-frequency signal. The frequency modulating unit modulates a frequency of the radio-frequency signal output from the phase selecting unit. The amplitude modulating unit modulates an amplitude of the radio-frequency signal output from the frequency modulating unit according to, for example, sinc function. The radio-frequency power amplifying unit amplifies the radio-frequency signal output from the amplitude modulating unit. As a result of an operation of each unit, the transmitting unit 19 transmits the radio-frequency pulse corresponding to Larmor frequency to the radio-frequency coil 17.

The helmet-type head coil device (hereinafter, "head coil device") 21 is placed covering a head of the subject P entirely. The head coil device 21 incorporates therein eight elements, none of which are shown, which include loop-like coils. The elements incorporated in the head coil device 21 receive the magnetic resonance signal emitted from the subject P.

The receiving unit 25 includes a selector, a preamplifier, a phase sensitive detector, and an analog-digital converter. The selector selectively inputs the magnetic resonance signal output from the radio-frequency coil 17 and the head coil device 21. The preamplifier amplifies the magnetic resonance signal output from the selector. The phase sensitive detector detects a phase of the magnetic resonance signal output from the preamplifier. The analog-digital converter converts a signal output from the phase sensitive detector into a digital signal.

An operator console unit 20 has an interface unit 31, a data collecting unit 33, a reconstructing unit 35, a storage unit 37, a displaying unit 39, an input unit 41, and a controlling unit 43.

To the interface unit 31, the gradient magnetic-field power source 15, the transmitting unit 19, and the receiving unit 25 are connected. The interface unit 31 communicates signals transmitted and received between these connected units and the operator console unit 20.

The data collecting unit 33 collects a digital signal output from the receiving unit 25 via the interface unit 31. The data collecting unit 33 stores in the storage unit 37 the collected digital data, that is, magnetic resonance signal data. The reconstructing unit 35 performs a reconstruction such as a post-processing, that is, Fourier transform to the magnetic resonance signal data stored in the storage unit 37 to obtain spectrum data or image data of a desired nuclear spin in the subject P.

The storage unit 37 stores the magnetic resonance signal data, and the spectrum data or the image data, per a subject P. The displaying unit 39 displays various information such as the spectrum data or the image data under the control of the controlling unit 43. A display device such as a liquid crystal display instrument can be used as the displaying unit 39. The input unit 41 receives various instructions or information input by an operator. The controlling unit 43 totally controls these units to control an imaging operation of the MRI apparatus body.

In the MRI apparatus 100 configured in such a manner, the receiving unit 25 receives a magnetic resonance signal, which the radio-frequency coil 17 and the head coil device 21 output, to generate magnetic resonance signal data. Then, the controlling unit 43 performs an entire imaging of the subject P based on the magnetic resonance signal data by means of the radio-frequency coil 17. In addition, the controlling unit 43 performs a local imaging of the head of the subject P based on the magnetic resonance signal data by means of the head coil device 21.

Figure 2:
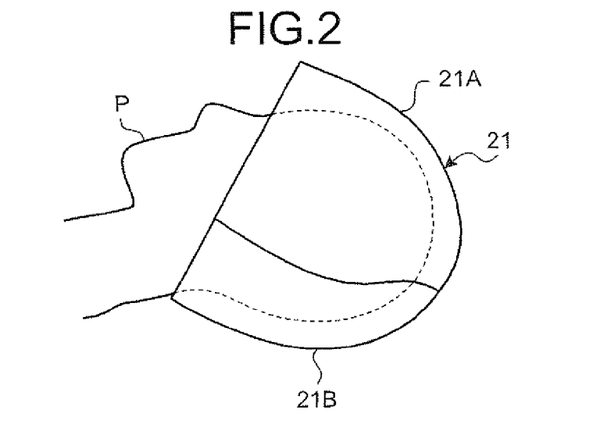
FIG. 2 is a side view illustrating a head coil device shown in FIG. 1 in an enlarged manner.
Figure 3:
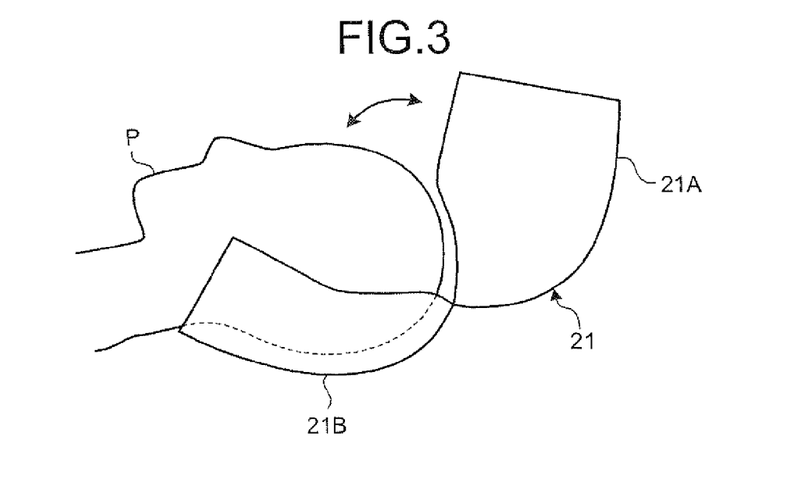
FIG. 3 is a side view illustrating a state where the head coil device shown in FIG. 2 has been opened.

FIG. 2 is a side view illustrating the head coil device 21 shown in FIG. 1 in an enlarged manner. FIG. 3 is a side view illustrating a state where the head coil device 21 is opened. To make it easy to attach and detach the head coil device 21 relative to the subject P, the head coil device 21 is capable of being divided into an upper coil device 21A and a lower coil device 21B.

Figure 4:
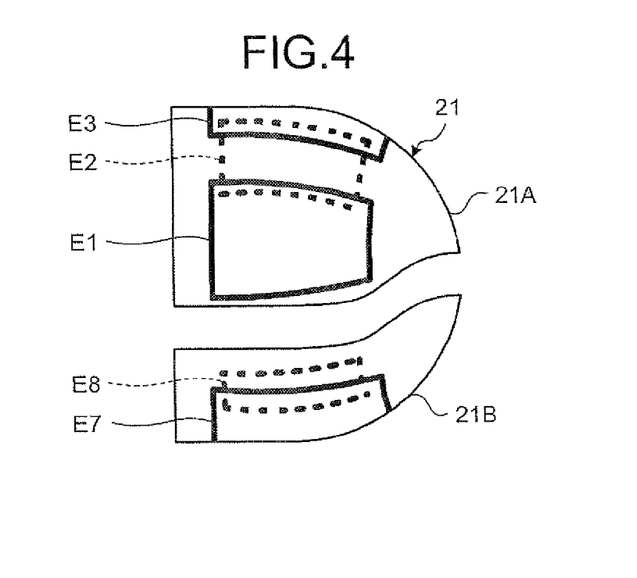
FIG. 4 is a side view illustrating an arrangement of eight elements that the head coil device has incorporated therein.
Figure 5:
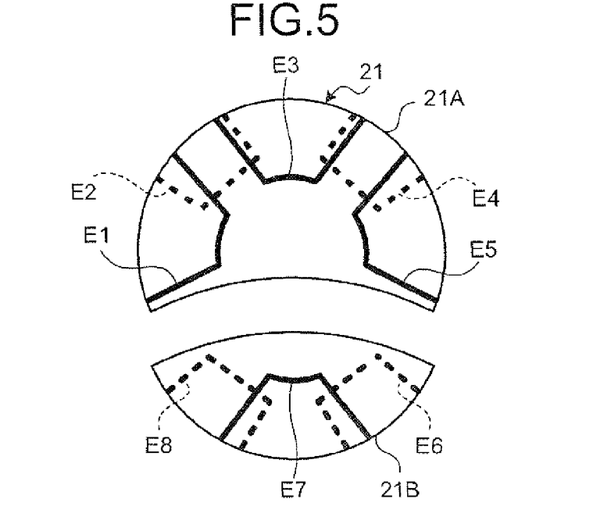
FIG. 5 is a front view illustrating the arrangement of the eight elements that the head coil device has incorporated therein.

FIG. 4 is a side view illustrating an arrangement of eight elements that the head coil device 21 has incorporated therein. FIG. 5 is a front view illustrating the same. The head coil device 21 has eight elements E1 to E8, all of which are provided in a case. The eight elements E1 to E8 are arranged in alignment so as to circle the head along a head surface of the subject P. In other words, the eight elements E1 to E8 are arranged in a line in an alignment direction on a curved surface (arrangement plain surface) that circles the head of the subject P over whole circumference thereof.

Among the eight elements E1 to E8, the five elements E1 to E5 are arranged in the upper coil device 21A. The remaining three elements E6 to E8 are arranged in the lower coil device 21B. In other words, the head coil device 21 are divided at positions between the element E1 and the element E8, which are adjacent to each other, and between the element E5 and the element E6, which are adjacent to each other, at a surface perpendicular to the alignment direction.

Figure 6:
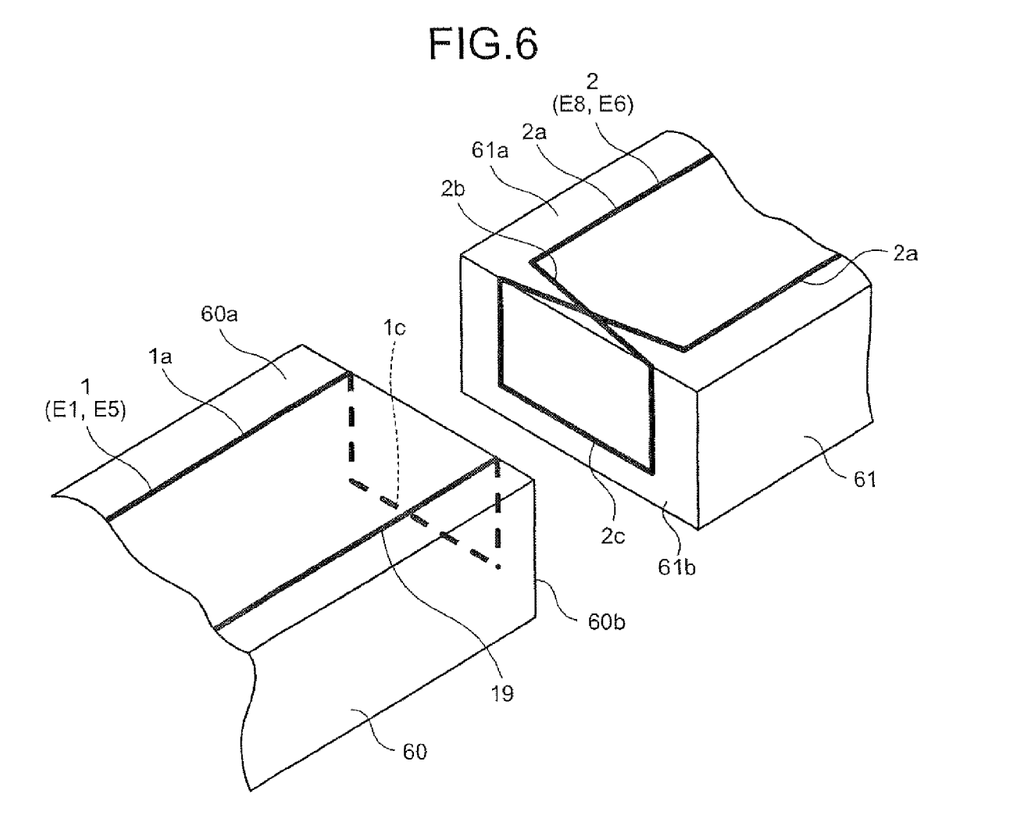
FIG. 6 is a perspective view illustrating a detail of adjacent two elements at a division portion.

FIG. 6 is a perspective view illustrating a detail of the adjacent two elements at the division/join portion of the case. In FIG. 6, elements E1 and E5 are explained as a first element 1, and the elements E8 and E6 are explained as a second element 2. It is assumed for the sake of explanation that each of the first element 1 and the second element 2 is formed on a substrate 60 and a substrate 61, respectively, each of which has a flattened rectangular parallelepiped shape, in a circuit pattern.

The first element 1 has a single circuit pattern that forms a loop on the substrate 60 (FIG. 6 indicates only an end portion at the division/join side). The first element 1 includes a main loop portion 1a, which is formed on a main surface (an upper surface, a large-area surface) 60a of the substrate 60 and extends to an end of the substrate 60, and a sub-loop portion 1c (a first cancellation-electromotive-force inducting portion), which is formed so as to bend along an end surface 60b of the substrate 60 from the main loop portion 1a. The main loop portion 1a is formed as two parallel patterns. The sub-loop portion 1c is formed as a substantially squared U-shaped pattern that connects both ends thereof with these two patterns.

The second element 2 has a single circuit pattern that forms a loop on the substrate 61 (FIG. 6 only indicates the end portion at the division/join side). The second element 2 includes a main loop portion 2a that is formed on a main surface 61a of the substrate 61, a crossed portion 2b that is formed at a portion nearest to the end on the main surface 61a of the substrate 61, and a sub-loop portion 2c (a second cancellation-electromotive-force inducting portion) that is formed so as to bend along an end surface 61b of the substrate 61 from the crossed portion 2b. The main loop portion 2a is formed as two parallel patterns provided on the main surface 61a. The crossed portion 2b is formed as a substantially X-shaped pattern where, from these two parallel patterns, the patterns mutually bend and extend in a central direction to cross at a central portion, and thereafter, extend to a proximity of the pattern on an opposite side. The sub-loop portion 2c is formed as the substantially squared U-shaped pattern that connects both ends thereof with the crossed portion 2b.

At the crossed portion 2b, an insulator is interposed therebetween when manufactured. Accordingly, the two patterns cross while being insulated. The first element 1 and the second element 2 are arranged in such a manner that the sub-loop portion 1c and the sub-loop portion 2c are mutually faced such that respective squared U-shape portions are overlapped with each other. For example, a case, which accommodates the first element 1 and the second element 2, is divided at the surface perpendicular to the alignment direction between the sub-loop portion 1c and the sub-loop portion 2c.

Figure 7:
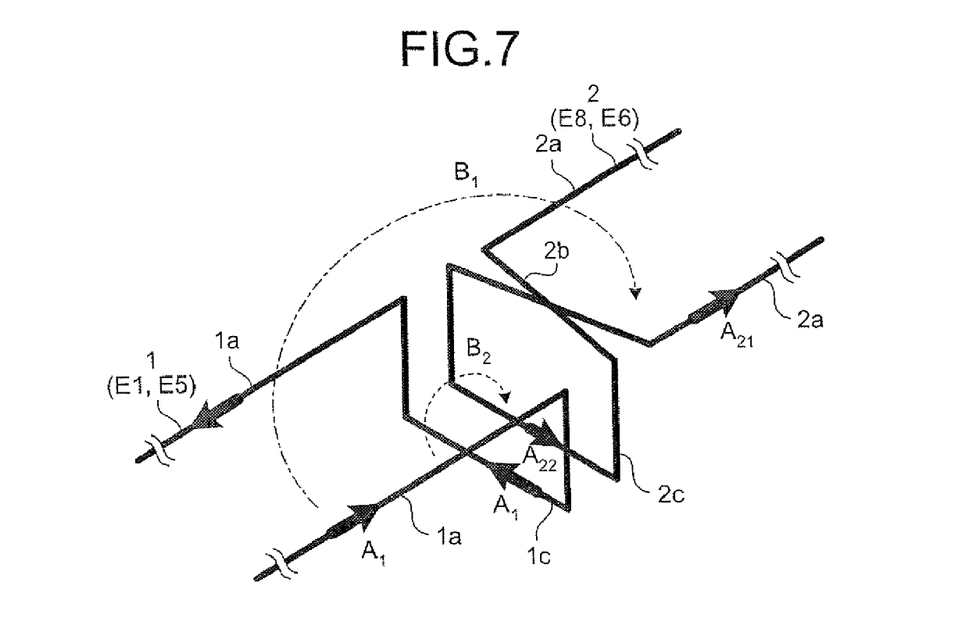
FIG. 7 is a perspective view for explaining that a first element and a second element are decoupled.

FIG. 7 is a perspective view for explaining that the first element 1 and the second element 2 are decoupled. The sub-loop portion 1c of the first element 1 and the sub-loop portion 2c of the second element 2 are provided in such a manner that a magnetic flux, which interlinks from within one sub-loop portion to within the other sub-loop portion, faces the alignment direction, and further, that an induced electromotive force that the magnetic flux generates within the other sub-loop portion and the induced electromotive force, which the magnetic flux interlinking from within one main loop portion to within the other main loop generates, become mutually oppositely-oriented and have the same magnitude.

In other words, for example, when a current $A_1$ flows in the first element 1, a magnetic flux $B_2$, which interlinks from within a surface that the sub-loop portion 1c encircles to within the surface that the sub-loop portion 2c encircles, is directed so as to face the alignment direction of the elements. A current $A_{22}$ that attempts to flow in the sub-loop portion 2c due to the induced electromotive force that the magnetic flux $B_2$ generates in the sub-loop portion 2c and a current $A_{21}$ that attempts to flow in the main loop portion 2a due to an induced electromotive force that a magnetic flux $B_1$, interlinking from the main loop portion 1a to the main loop portion 2a, generates are provided so as to become mutually oppositely-oriented and have the same magnitude. Because the area, which the sub-loop portion 1c encircles, and the area, which the sub-loop portion 2c encircles, determine the magnitude of the magnetic flux $B_2$, an adjustment of the both areas can easily result in such relationship.

It is not necessary for the sub-loop portion 1c and the sub-loop portion 2c to have strictly become the relationship. In other words, all the sub-loop portion 1c and the sub-loop portion 2c need is to have substantially become the relationship, and all the first element 1 and the second element 2 need is to be adjusted wholly in the entire coil such that, among the magnetic fields which are generated when the current flows in one coil, a summation of the magnetic fields that interlink with the other coil becomes zero.

The MRI apparatus according to the present embodiment includes the first element 1 that has the first main loop portion 1a parallel to the arrangement plain surface and the first sub-loop portion 1c (the first cancellation-electromotive-force inducting portion) provided so as to become substantially perpendicular to the arrangement plain surface at a portion of the second element 2 side of the first main loop portion 1a, and the second element 2 that has the second main loop portion 2a parallel to the arrangement plain surface and the second sub-loop portion 2c (the second cancellation-electromotive-force inducting portion) provided so as to be opposed to the first sub-loop portion 1c (the first cancellation-electromotive-force inducting portion) at a portion of the first element 1 side of the second main loop portion 2a. This arrangement makes it possible to perform the decoupling without overlapping the first element 1 and the second element 2 on the arrangement plain surface. Therefore, the division between the two coils allows a shape of the division/join portion in the coil apparatus to become simple. Additionally, this arrangement makes it possible to increase strength at the division/join portion or to improve a designability, and further, to reduce costs.

According to the present embodiment, because each of the cancellation-electromotive-force inducting portions, which induces an electromotive force to perform a cancellation such that the summation of the magnetic fields interlinking with the other coil becomes zero, includes the sub-loop portions 1c and 2c, respectively, having the substantially squared U-shape, it is possible to effectively secure the area of the cancellation-electromotive-force inducting portion, and a size of the division/join portion does not uselessly become large. In addition, a formation in the squared U-shape allows to easily calculate and adjust the area.

The first element 1 and the second element 2 according to the present embodiment have been applied to the division portion in the helmet-type head coil device 21. However, as long as the device is the coil device where the elements are provided while being arranged, and divided and joined at a predetermined position, the first element 1 and the second element 2 are applicable also to other coil devices (e.g., a leg coil device, a foot coil device).

In the present embodiment, for convenience sake, the first element 1 and the second element 2 are explained while being defined to have been formed on the substrate 60 and the substrate 61, respectively, each having the flattened rectangular parallelepiped shape, in the circuit pattern. However, the first element 1 and the second element 2 shall not be limited to these, and for example, may be formed in such a manner that an inductor such as a copper line is wound around a bobbin and that a plate including the inductor is stuck to a substrate. Any kind of forms are applicable to the first element 1 and the second element 2.

The crossed portion 2b according to the present embodiment has been provided at an endmost portion on the main surface 61a of the substrate 61. However, the crossed portion 2b may be provided at an uppermost portion on the end surface 61b (at a side nearest to the main surface).

Second Embodiment

Figure 8:
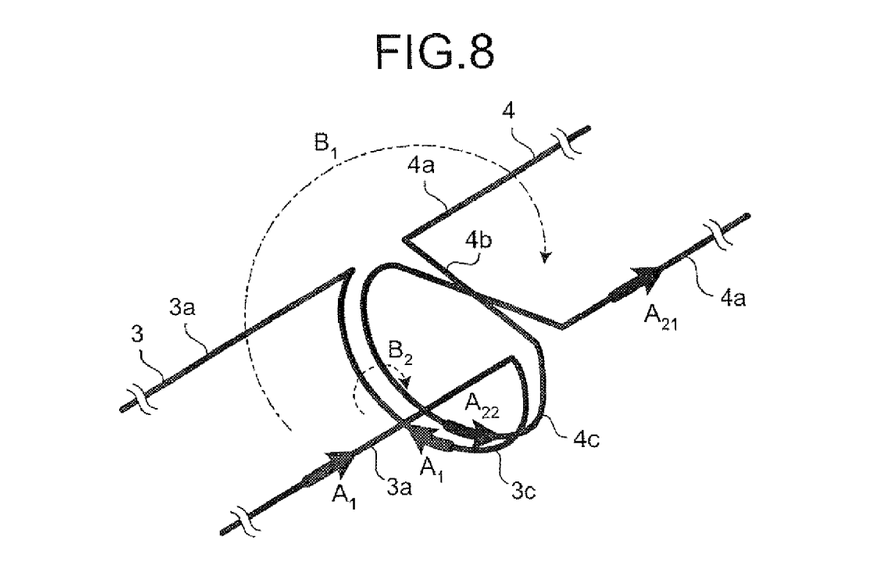
FIG. 8 is a perspective view for explaining a shape of a division/join portion of a coil device according to a second embodiment of the present invention.

FIG. 8 is a perspective view for explaining a shape of the division/join portion of the coil device according to a second embodiment of the present invention. In FIG. 8, a first element 3 has the single circuit pattern that forms the loop. The first element 3 includes a main loop portion 3a, which is formed as the two parallel patterns, and a sub-loop portion 3c (first cancellation-electromotive-force inducting portion), which is formed at a second element 4 side of the main loop portion 3a so as to bend from the main loop portion 3a. The sub-loop portion 3c is formed as a substantially circular-arcuate pattern that connects both ends thereof with the two patterns of the main loop portion 3a.

The second element 4 has single circuit pattern that forms the loop. The second element 4 includes a main loop portion 4a formed as the two parallel patterns, a crossed portion 4b formed at the first element 3 side of the main loop portion 4a, and a sub-loop portion 4c (second cancellation-electromotive-force inducting portion) formed so as to bend from the crossed portion 4b. The sub-loop portion 4c is formed as the substantially circular-arcuate pattern that connects both ends thereof with the crossed portion 2b.

The first element 3 and the second element 4 are arranged in such a manner that the sub-loop portion 3c and the sub-loop portion 4c are mutually faced such that respective circular-arcuate portions thereof are overlapped with each other. The first element 3 and the second element 4 are configured such that, among the magnetic fields which are generated when the current flows in one coil, the summation of the magnetic fields, which interlink with the other coil, becomes zero.

The first element 3 and the second element 4 according to the present embodiment perform the same operations as the elements according to the first embodiment, whereby the substantially same effect can be obtained.

Third Embodiment

Figure 9:
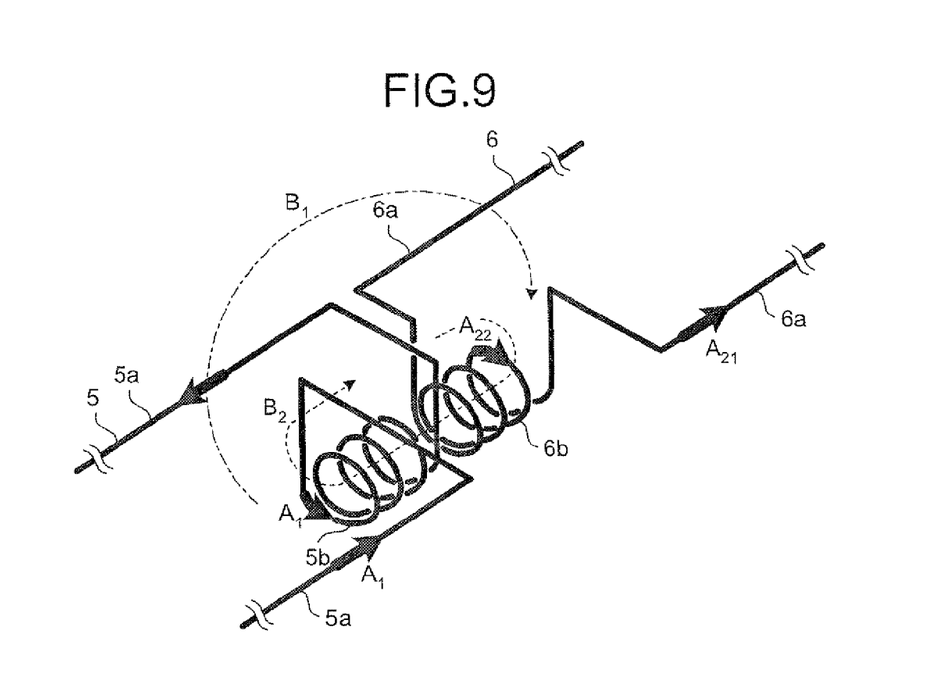
FIG. 9 is a perspective view for explaining a shape of a division/join portion of a coil device according to a third embodiment of the present invention.

FIG. 9 is a perspective view for explaining a shape of the division/join portion of the coil device according to a third embodiment of the present invention. In FIG. 9, a first element 5 has the single circuit pattern that forms the loop. The first element 5 includes a main loop portion 5a formed as the two parallel patterns and a winding portion 5b (first cancellation-electromotive-force inducting portion) formed by being wound several times in a solenoid-coil shape at a center of a second element 6 side of the main loop portion 5a.

The winding portion 5b is formed in the following manner. That is, the pattern, which has bent from one end of one main loop portion 5a (near side in FIG. 9) formed on the arrangement plain surface to a central side, extends to an opposite side beyond the center; afterward, the pattern bends so as to become perpendicular to the arrangement plain surface, and thereafter, extends in a direction of the second element 6 while at the same time being spirally wound for a predetermined times in a counterclockwise direction toward the second element 6; subsequently, the pattern goes back to the arrangement plain surface, and goes beyond the center again, and then, is connected with the other main loop portion 5a.

The second element 6 has the single circuit pattern that forms the loop. The second element 6 includes a main loop portion 6a formed as the two parallel patterns and a winding portion 6b (second cancellation-electromotive-force inducting portion) formed at the center of the first element 5 side of the main loop portion 6a while being wound several times in the solenoid-coil shape.

The winding portion 6b is formed in the following manner. That is, the pattern, which has bent from one end of one main loop portion 6a (near side in FIG. 9) formed on the arrangement plain surface to the central side, does not go beyond the center, but bends so as to become perpendicular to the arrangement plain surface; thereafter, extends in a direction of the first element 5 while at the same time being spirally wound for the same times as the winding portion 5b in a counterclockwise direction toward the first element 5; subsequently, the pattern goes back to the arrangement plain surface, and then, is connected with the other main loop portion 6a.

The first element 5 and the second element 6 are arranged in such a manner that solenoid-coil-shaped portions of the winding portions 5b and 6b are mutually faced such that central axes thereof become coincident with each other. The first element 5 and the second element 6 are provided such that, for example, when the current $A_1$ flows in the first element 5, the magnetic flux $B_2$, which interlinks from within the winding portion 5b to within the winding portion 6b, is directed so as to face the alignment direction of the coils, and the current $A_{22}$ that attempts to flow in the winding portion 6b due to the induced electromotive force that the magnetic flux $B_2$ generates in the winding portion 6b, and the current $A_{21}$ that attempts to flow in the main loop portion 6a due to the induced electromotive force that the magnetic flux $B_1$ interlinking from the main loop portion 5a to the main loop portion 6a, generates, become mutually oppositely-oriented and have the same magnitude. Because the areas, which the winding portions 5b and 6b encircle, and the number of windings determine the magnitude of the magnetic flux $B_2$, an adjustment of the number of windings can easily result in such relationship.

It is not necessary for the winding portion 5b and the winding portion 6b to have strictly become the relationship. All the first element 5 and the second element 6 need is to be configured in the entire coil such that, among the magnetic fields that are generated when the current flows in one coil, the summation of the magnetic fields, which interlink with the other coil, becomes zero.

According to the present embodiment, in addition to being capable of obtaining the substantially same effect as the first embodiment, because each of the cancellation-electromotive-force inducting portions, which induces the electromotive force to perform the cancellation, includes the winding portions 5b and 6b, respectively, each having the solenoid-coil shape, and it is possible to effectively secure the magnitude of the electromotive-force by means of the number of windings, the size of the case of the division/join portion can become further smaller. In addition, a change in the number of windings can lead to an easy adjustment.

Forth Embodiment

Figure 10:
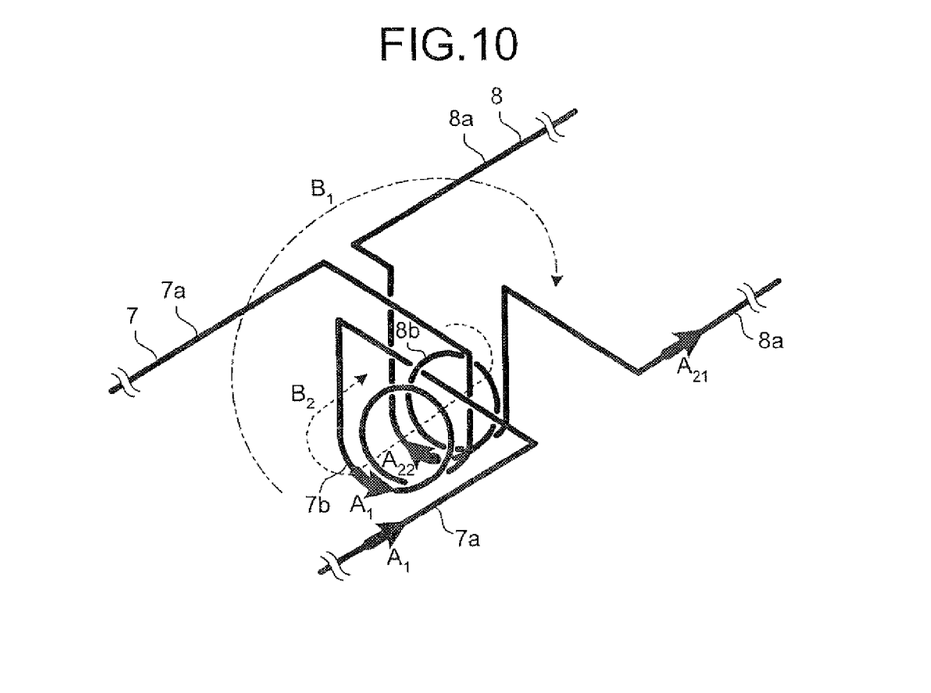
FIG. 10 is a perspective view for explaining a shape of a division/join portion of a coil device according to a forth embodiment of the present invention.

FIG. 10 is a perspective view for explaining a shape of the division/join portion of the coil device according to a forth embodiment of the present invention. In FIG. 10, in the same way as the element according to the third embodiment, a first element 7 includes a main Loop portion 7a formed as the two parallel patterns and a winding portion 7b (first cancellation-electromotive-force inducting portion) formed by being wound in the solenoid-coil shape. However, the winding portion 7b is formed such that the number of windings is one time.

In the same way as the element according to the third embodiment, a second element 8 also includes a main loop portion 8a formed as the two parallel patterns and a winding portion 8b (second cancellation-electromotive-force inducting portion) formed by being wound in the solenoid-coil shape. However, the winding portion 8b is formed such that the number of windings is one time.

The first element 7 and the second element 8 according to the present embodiment also perform the same operations as the elements according to the third embodiment, whereby the substantially same effect can be obtained.

Fifth Embodiment

In the embodiments 1 to 4, the decoupling of the adjacent two elements is explained. However, when a number of coils are used, it is required to perform the decoupling also relative to two non-adjacent elements. Therefore, in a fifth embodiment, the decoupling of the non-adjacent elements will be explained.

Figure 11A:
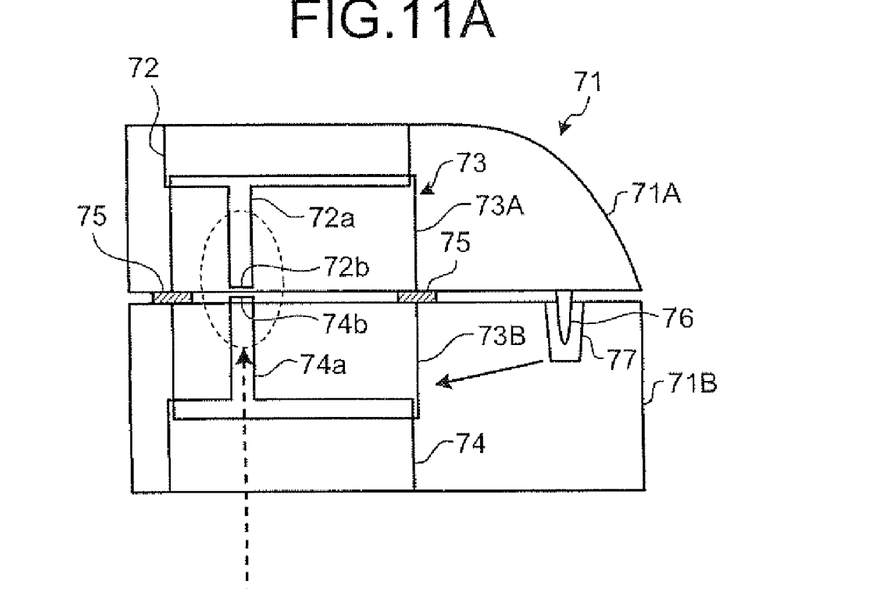
FIGS. 11A, 11B, and 11C are views illustrating another head coil device.

FIG. 11A is a side view illustrating a head coil device different from the head coil device shown in the first embodiment. A head coil device 71 is capable of being divided into an upper coil device 71A and a lower coil device 71B. An element 72 is placed adjacently to an element 73. Providing an overlapped portion results in the decoupling of the both elements. The element 73 is placed adjacently also to an element 74. Providing an overlapped portion results in the decoupling of the both elements. When the head coil 71 is closed, the upper portion 73A and the lower portion 73B are connected with each other at two positions by use of an electrical connector 75, whereby the element 73 forms a loop.

Figure 11B:
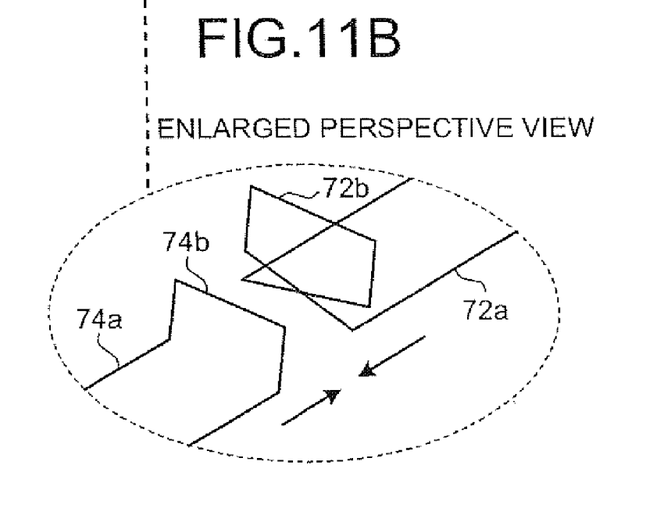

The element 72 has a main loop portion for decoupling 72a and a sub-loop portion for decoupling 72b. The element 74 has a main loop portion for decoupling 74a and a sub-loop portion for decoupling 74b. As shown in FIG. 11B, the sub-loop portion for decoupling 72b is provided while being crossed from the main loop portion for decoupling 72a, and is provided facing the sub-loop portion for decoupling 74b. As described above, the sub-loop portion for decoupling 72b and the sub-loop portion for decoupling 74b are faced each other, whereby enabling to decouple the element 72 and the element 74 both of which are not adjacent.

However, the sub-loop portion for decoupling 72b and the sub-loop portion for decoupling 74b need to be faced each other without any misalignment. Therefore, here, a guide pin 76 is provided on the upper coil device 71A and the guide pin 76 is inserted into a hole 77 provided in the lower coil device 71B, whereby a positional relationship is retained where the sub-loop portion for decoupling 72b and the sub-loop portion for decoupling 74b are faced each other.

Figure 11C:
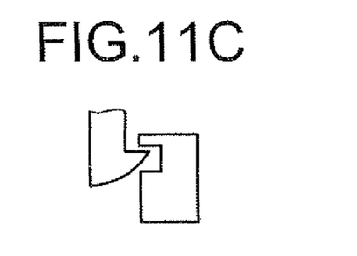

As a means to retain the positional relationship where the sub-loop portion for decoupling 72b and the sub-loop portion for decoupling 74b are faced each other, it is also possible to provide a locking mechanism as shown in FIG. 11C between the upper coil device 71A and the lower coil device 71B. In addition, here, the sub-loop portion for decoupling 72b and the sub-loop portion for decoupling 74b are faced each other, whereby it is possible to decouple the element 72 and the element 74 both of which are not adjacent. However, the decoupling can also be performed by overlapping one portion of the main loop portion for decoupling 72a and of the main loop portion for decoupling 74a with each other without providing the sub-loop portion for decoupling 72b and the sub-loop portion for decoupling 74b.

Figure 12:
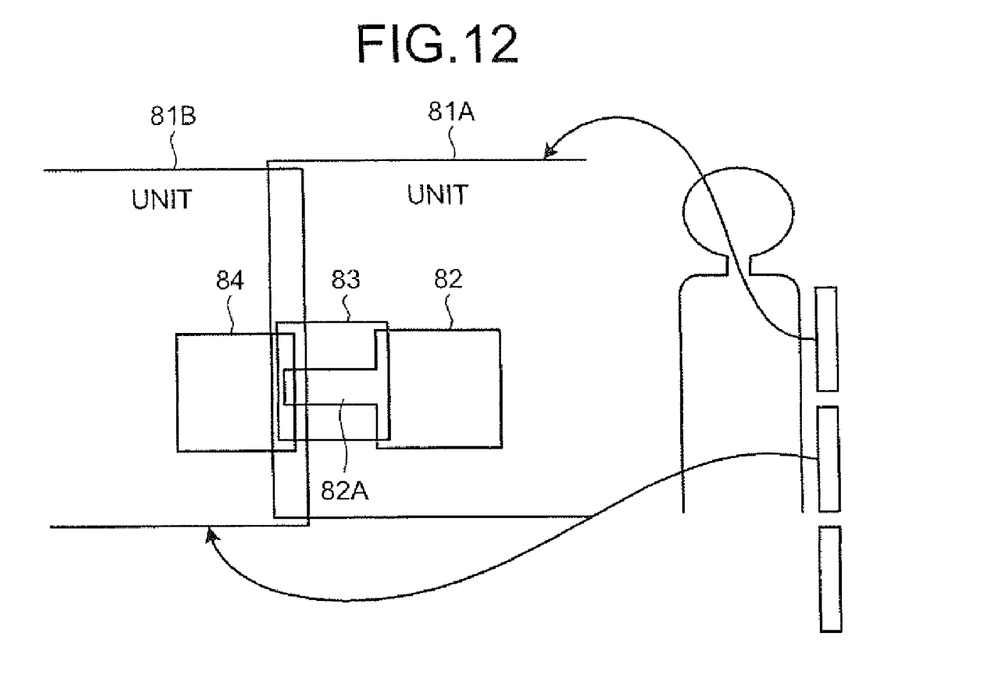
FIG. 12 is a view illustrating one portion of an entire-body coil device configured of a plurality of units.

FIG. 12 is a view illustrating one portion of an entire-body coil device configured of a plurality of units. Each unit has a plurality of elements. One portion is overlapped between an element 82 and an element 83, which are adjacent to each other, in a unit 81A, whereby the decoupling is performed. Additionally, one portion is overlapped also between the element 83 in the unit 81A and an element 84 in a unit 81B, whereby the decoupling is performed. When the entire-body coil device is used, the unit 81A and the unit 81B are not necessarily used by being connected with each other depending on an imaging region of a patient. Therefore, any element does net exist where a loop is formed because of the connection of the unit 81A with the unit 81B.

The element 82 in the unit 81A includes a loop portion for decoupling 82A. The loop portion for decoupling 82A is overlapped with the element 84 in the unit 81B by one portion, whereby the decoupling is performed between the element 82 and the element 84 which are not adjacent each other. Here, the loop portion for decoupling 82A is overlapped with the element 84 in the unit 81B by one portion. However, as shown in FIG. 11, a main loop portion for decoupling and a sub-loop portion for decoupling are provided at each element such that one sub-loop portion crosses the main loop portion and is placed facing the other sub-loop portion, whereby the decoupling can be also performed.

Figure 13:
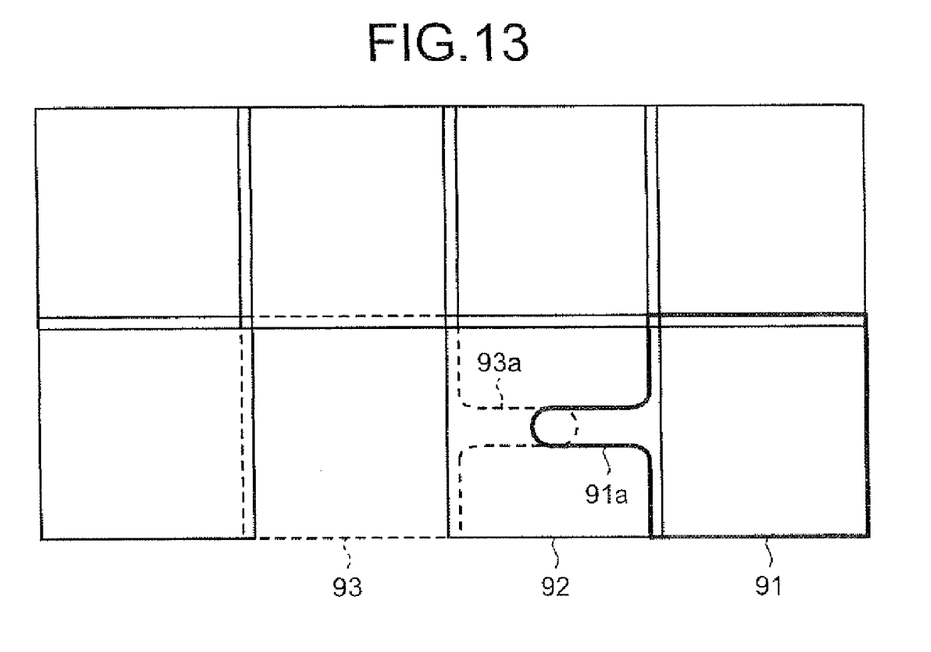
FIG. 13 is a view illustrating another decoupling example between non-adjacent elements in an entire-body coil device configured of a plurality of units.

FIG. 13 is a view illustrating another decoupling example between non-adjacent elements in an entire-body coil device configured of a plurality of units. Also in this example, one portion is overlapped between adjacent elements, whereby the decoupling is performed. On the other hand, between non-adjacent elements, a loop portion for decoupling is provided at each element and is overlapped with another loop portion for decoupling, whereby the decoupling is performed. For example, an element 91 has a loop portion for decoupling 91a. The loop portion for decoupling 91a is overlapped with a loop portion 93a of an element 93 by one portion, whereby the decoupling is performed between the element 91 and the element 93. Here, the loop portions for decoupling are overlapped with each other by one portion. However, as shown in FIG. 11, the main loop portion for decoupling and the sub-loop portion for decoupling are provided at each element such that one sub-loop portion crosses the main loop portion and is placed facing the other sub-loop portion, whereby the decoupling can be also performed.

Figure 14:
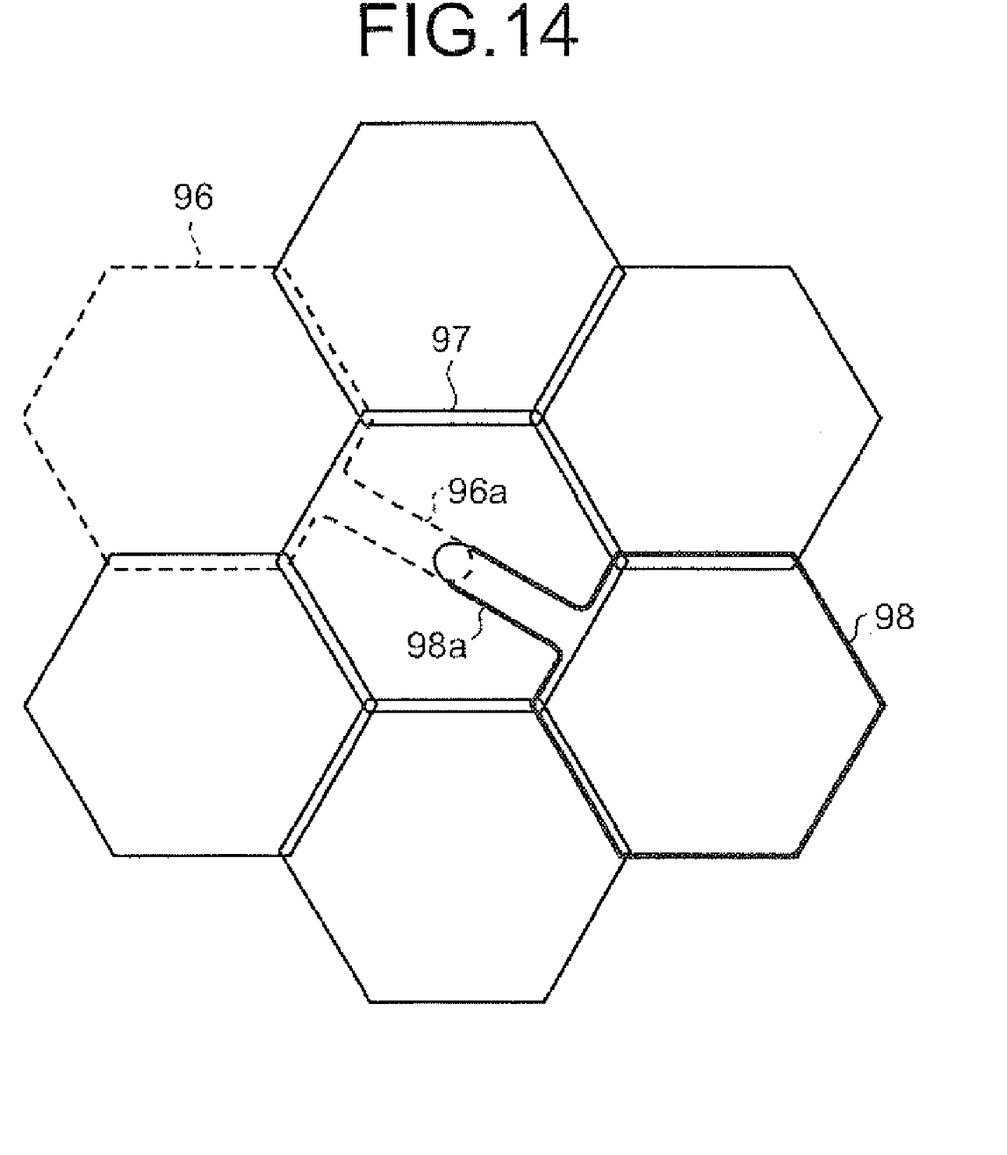
FIG. 14 is a view illustrating one example of another coil device configured of a plurality of elements.

FIG. 14 is a view illustrating one example of another coil device configured of a plurality of elements. Also in this example, one portion is overlapped between adjacent elements, whereby the decoupling is performed. For example, between an element 96 and an element 97 which are adjacent to each other, or between the element 97 and an element 98 which are adjacent to each other, the decoupling is performed by overlapping one portion. On the other hand, between non-adjacent elements, a loop portion for decoupling is provided at each element and is overlapped with other loop portion for decoupling, whereby the decoupling is performed. For example, the elements 96 and 98 have a loop portion for decoupling 96a and a loop portion for decoupling 98a, respectively. The loop portion for decoupling 96a is overlapped with the loop portion for decoupling 98a by one portion, whereby the decoupling is performed between the element 96 and the element 98. Here, the loop portions for decoupling are overlapped with each other by one portion. However, as shown in FIG. 11, the main loop portion for decoupling and the sub-loop portion for decoupling are provided at each element such that one sub-loop portion crosses the main loop portion and is placed facing the other sub-loop portion, whereby the decoupling can be also performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio-frequency (RF) coil wherein a plurality of RF coil elements are arranged to receive a magnetic resonance signal from a subject, said coil comprising:
    at least first and second non-adjacent coil elements, said first coil element having a main loop and a sub-loop connected with the main loop in series, and
    said sub-loop of the first coil element being positioned to effect decoupling with said second coil element by using the sub-loop to reduce mutual RF coupling between said first and second coil elements such that when RF current flows in one coil element, thereby induced RF current in the other coil element is minimized.

2. The RF coil according to claim 1, wherein the first and the second coil elements have respectively corresponding first and second main loops with respectively corresponding serially connected first and second sub-loops positioned with respect to one another to effect decoupling between the two coil elements by using the first and the second sub-loops.

3. The RF coil according to claim 2, wherein:
    a plurality of coil elements are arranged in each of a first and a second unit, which can be joined with or separated from each other, and the first coil element is one of the plurality of coil elements in the first unit, and the second coil element is one of the plurality of coil elements in the second unit.

4. The RF coil according to claim 3, wherein:
    the second sub-loop faces the first sub-loop at a portion capable of joining/separating, and a winding direction of the second sub-loop is oppositely-oriented with respect to a winding direction of the first sub-loop.

5. The RF coil according to claim 4, further comprising:
    a retaining unit that retains a positional relationship where the first and the second sub-loops are mutually faced adjacent each other across an openable joint between said first and second units.

6. The RF coil according to claim 4, wherein:
    the first sub-loop and the second sub-loop generate respective induced electromotive forces in such a manner that among magnetic fields generated when a current flows in one coil element, a summation of magnetic fields interlinking with the other element becomes substantially zero.

7. The RF coil according to claim 4, wherein:
    the first sub-loop and the second sub-loop generate respective induced electromotive forces in such a manner that an induced electromotive force that magnetic flux, interlinking from within one sub-loop to within the other sub-loop, generates within the other sub-loop, and an induced electromotive force that magnetic flux, interlinking from within one main loop to within the other main loop, generates within the other main loop, become mutually oppositely-oriented and have substantially the same magnitude.

8. The RF coil according to claim 4, wherein:
the first sub-loop includes a loop portion that bends in a direction substantially perpendicular to an arrangement surface from an end portion of the second coil element side of the first main loop, and
the second sub-loop includes a crossed portion provided at an end portion of the first coil element side of the second main loop, and a loop portion connected with the crossed portion and facing the first sub-loop.

9. The RF coil according to claim 4, wherein:
each of the first sub-loop and the second sub-loop has a squared U-shape.

10. The RF coil according to claim 4, wherein:
the first sub-loop includes a first winding portion with a central axis thereof directed toward an alignment direction of the second coil element side of the first main loop, and
the second sub-loop includes a second winding portion on an extension line of the first winding portion of the first coil element side of the second main loop.

11. A radio-frequency (RF) coil comprising:
a plurality of coil elements, each of which receives a magnetic resonance signal from a subject, arranged in each of a first unit and a second unit, and the two units can be joined with or separated from each other,
at least a first coil element in the first unit having a first main loop and a first sub-loop connected with the first main loop in series,
at least a second coil element in the second unit having a second main loop, and a second sub-loop connected with the second main loop in series and facing the first sub-loop at a portion of said first and second units that is configured for joining/separating and oppositely-oriented winding direction with respect to a winding direction of the first sub-loop, and
a retaining unit configured to retain a positional relationship where the first sub-loop and the second sub-loop are mutually faced across from one another at an openable joint between said first and second units.

12. The RF coil according to claim 11, wherein:
a third coil element among the plurality of coil elements includes a third main loop having conductive segments electrically connectable with each other via an electrical connector in a state where the first unit is joined with the second unit.

13. The RF coil according to claim 12, wherein:
a third coil element among the plurality of the coil elements includes a third main loop having conductive segments electrically connectable with each other via an electrical connector in a state where the first unit is joined with the second unit.

14. The RF coil according to claim 11, wherein:
the first sub-loop and the second sub-loop generate respective induced electromotive forces in such a manner that among magnetic fields generated when a current flows in one coil element, a summation of magnetic fields interlinking with the other element becomes substantially zero.

15. The RF coil according to claim 11, wherein:
the first sub-loop and the second sub-loop generate respective induced electromotive forces in such a manner that an induced electromotive force that magnetic flux, interlinking from within one sub-loop to within the other sub-loop, generates within the other sub-loop, and an induced electromotive force that magnetic flux, interlinking from within one main loop to within the other main loop, generates within the other main loop, become mutually oppositely-oriented and have substantially the same magnitude.

16. The RF coil according to claim 11, wherein:
the first sub-loop includes a loop portion that bends in a direction substantially perpendicular to an arrangement surface from an end portion of the second coil element side of the first main loop, and
the second sub-loop includes a crossed portion provided at an end portion of the first coil element side of the second main loop, and a loop portion connected with the crossed portion and facing the first sub-loop.

17. The RF coil according to claim 11, wherein:
each of the first sub-loop and the second sub-loop has a squared U-shape.

18. The RF coil according to claim 11, wherein:
the first sub-loop includes a first winding portion having a central axis thereof directed toward an alignment direction of the second coil element side of the first main loop, and
the second sub-loop includes a second winding portion on an extension line of the first winding portion of the first coil element side of the second main loop.

19. A radio-frequency (RF) coil comprising:
a plurality of RF coil elements, each of which receives a magnetic resonance signal from a subject in use, said RF coil units being disposed in a first unit and a second unit, which units can be joined with or separated from each other,
a first coil element in the first unit having a first main loop, and a first sub-loop connected with the first main loop in series,
a second coil element in the second unit having a second main loop, and a second sub-loop connected with the second main loop in series, facing the first sub-loop, and opposite-oriented with respect to a winding direction of the first sub-loop, and
a third coil element configured to provide a third main loop when conductive segments thereof are electrically connected together via an electrical connector in a state where the first unit is joined with the second unit.

20. The RF coil according to claim 19, wherein:
the first sub-loop and the second sub-loop generate respective induced electromotive forces in such a manner that among magnetic fields generated when a current flows in one coil element, a summation of magnetic fields interlinking with the other element becomes substantially zero.

21. The RF coil according to claim 19, wherein:
the first sub-loop and the second sub-loop generate respective induced electromotive forces in such a manner that an induced electromotive force that magnetic flux, interlinking from within one sub-loop to within the other sub-loop, generates within the other sub-loop, and an induced electromotive force that magnetic flux, interlinking from within one main loop to within the other main loop, generates within the other main loop, become mutually oppositely-oriented and have substantially the same magnitude.

22. The RF coil according to claim 19, wherein:
the first sub-loop includes a loop portion that bends in a direction substantially perpendicular to an arrangement surface from an end portion of the second coil element side of the first main loop, and
the second sub-loop includes a crossed portion provided at an end portion of the first coil element side of the second main loop, and a loop portion connected with the crossed portion and facing the first sub-loop.

23. The RF coil according to claim 19, wherein:
each of the first sub-loop and the second sub-loop has a squared U-shape.

24. A magnetic resonance imaging (MRI) apparatus comprising:
an applying unit that applies changing gradient magnetic fields to a subject while applying a static magnetic field to the subject;
a plurality of RF coil elements, each of which in use receives a magnetic resonance signal from the subject to which the static magnetic field and the gradient magnetic fields are applied,
at least first and second non-adjacent coil elements, said first coil element having a main loop and a sub-loop connected with the main loop in series, and
said sub-loop being configured to effect decoupling with said second coil element by using the sub-loop to reduce mutual RF coupling between said first and second coil elements such that when RF current flows in one coil element, thereby induced RF current in the other coil element is minimized.

25. A magnetic resonance imaging (MRI) apparatus comprising:
an applying unit that applies changing gradient magnetic fields to a subject while applying a static magnetic to the subject;
a plurality of coil elements disposed in each of a first unit and a second unit which can be joined with or separated from each other, each of the coil elements receiving in use a magnetic-resonance signal from the subject to which the static magnetic field and the gradient magnetic fields are applied,
at least a first coil element in the first unit having a first main loop and a first sub-loop connected with the first main loop in series,
at least a second coil element in the second unit having a second main loop, and a second sub-loop connected with the second main loop in series, facing the first sub-loop at a joint portion of said units capable of joining/separating, and oppositely-oriented with respect to a winding direction of the first sub-loop, and
a retaining unit that retains a positional relationship where the first sub-loop and the second sub-loop are mutually faced across from each other at said joint portion.

* * * * *